(12) United States Patent
Zhao et al.

(10) Patent No.: US 9,577,651 B2
(45) Date of Patent: Feb. 21, 2017

(54) CIRCUITS FOR GENERATING SWEEP FREQUENCY SIGNAL

(71) Applicant: NUCTECH COMPANY LIMITED, Beijing (CN)

(72) Inventors: Ziran Zhao, Beijing (CN); Wenguo Liu, Beijing (CN); Zhiqiang Chen, Beijing (CN); Yuanjing Li, Beijing (CN); Wanlong Wu, Beijing (CN); Yinong Liu, Beijing (CN); Bin Sang, Beijing (CN); Lei Zheng, Beijing (CN)

(73) Assignee: NUCTECH COMPANY LIMITED, Beijing (CN)

(*) Notice: Subject to any disclaimer, the term of this patent is extended or adjusted under 35 U.S.C. 154(b) by 0 days.

(21) Appl. No.: 14/294,625

(22) Filed: Jun. 3, 2014

(65) Prior Publication Data

US 2015/0048868 A1 Feb. 19, 2015

(30) Foreign Application Priority Data

Aug. 15, 2013 (CN) .......................... 2013 1 0356592

(51) Int. Cl.
*H03B 19/00* (2006.01)
*H03L 7/24* (2006.01)
*H03B 23/00* (2006.01)
*H03L 7/22* (2006.01)

(52) U.S. Cl.
CPC ................ *H03L 7/24* (2013.01); *H03B 23/00* (2013.01); *H03L 7/22* (2013.01)

(58) Field of Classification Search
USPC ........................................................ 327/113
See application file for complete search history.

(56) References Cited

U.S. PATENT DOCUMENTS

| 6,229,399 | B1 * | 5/2001 | Tobise .................... H03L 7/093 327/147 |
|---|---|---|---|
| 2005/0083108 | A1 * | 4/2005 | Kiriaki .......................... 327/408 |
| 2006/0199563 | A1 * | 9/2006 | Kelly et al. .................. 455/333 |
| 2009/0088113 | A1 * | 4/2009 | Marsili et al. ............... 455/260 |
| 2012/0139586 | A1 * | 6/2012 | Dayi et al. ................... 327/105 |

\* cited by examiner

Primary Examiner — Lincoln Donovan
Assistant Examiner — Patrick Chen
(74) Attorney, Agent, or Firm — Pillsbury Winthrop Shaw Pittman LLP

(57) ABSTRACT

A circuit to generate a sweep frequency signal that includes a reference frequency source to generate a reference frequency signal, a first frequency combination circuit coupled to the reference frequency source, and operative to generate a sweep frequency signal in a first frequency band based on the reference frequency signal, a second frequency combination circuit coupled to the reference frequency source, and operative to generate a sweep frequency signal in a second frequency band different from the first frequency band based on the reference frequency signal, a multiple-level switch coupled to outputs of the first frequency combination circuit and the second frequency combination circuit, and a control circuit controlling the first and second frequency combination circuits and the multiple-level switch to output the sweep frequency signal in the first frequency band and the sweep frequency signal in the second frequency band at an output of the multiple-level switch alternately.

17 Claims, 2 Drawing Sheets

CIRCUITS FOR GENERATING SWEEP FREQUENCY SIGNAL

This application claims priority to Chinese patent application no. 201310356592.6, filed Aug. 15, 2013, which is incorporated herein in its entirety by reference.

TECHNICAL FIELD

Embodiments of the present invention generally relate to a microwave technique and, in particular, to one or more circuits to generate an ultra-wideband, quick sweep frequency signal that has a high pure spectrum.

BACKGROUND

A sweep frequency signal is typically used in a broadcast and communication system. A sweep frequency signal is usually generated by using a frequency reference source, a voltage controlled oscillator, a phase detector and a phase locked loop (PLL) comprising a filter feedback loop, the four parts being referred as a frequency synthesizer in combination. The width of the swept frequency of the PLL is limited by the operating frequency range of the voltage controlled oscillator. Noise in the sweep frequency signal is dependent on the time for sweeping of frequency. A long time for locking is needed for a low noise level, while the noise is large in order to obtain a quick sweep frequency output signal.

SUMMARY

Three characteristics, i.e., wide frequency band swept frequency, quick sweeping, and a high pure spectrum output (i.e., outputting with a low noise level), are the requirements of a millimeter wave imaging system on a sweep frequency signal. A currently used sweep frequency signal is generated by a signal frequency combiner. There is also a case where two frequency combiners with the same frequency range are used to improve the sweeping speed. Such a combination-type sweeping method can only improve the sweeping speed, but cannot extend the swept frequency width as well as improve the spectrum of the sweep frequency signal (i.e., reducing the noise). It cannot achieve a quick sweeping over a wide frequency band while outputting a signal having a high pure spectrum (i.e., with a low noise level).

In view of the problems of the art, there is provided a circuit to generate a sweep frequency signal, capable of achieving a quick sweeping over a wide frequency band while outputting a signal having a high pure spectrum.

In an aspect of the application, there is provided a circuit to generate a sweep frequency signal, the circuit comprising: a reference frequency source operative to generate a reference frequency signal; a first frequency combination circuit operating on a first frequency band, with an input coupled to an output of the reference frequency source, and operative to generate a sweep frequency signal in the first frequency band at its output based on the reference frequency signal; a second frequency combination circuit operating on a second frequency band different from the first frequency band, with an input coupled to the output of the reference frequency source, and operative to generate a sweep frequency signal in the second frequency band at its output based on the reference frequency signal; a multiple-level switch with an input coupled to an output of the first frequency combination circuit and to an output of the second frequency combination circuit; and a control circuit coupled to and controlling the first frequency combination circuit, the second frequency combination circuit and the multiple-level switch to output the sweep frequency signal in the first frequency band and the sweep frequency signal in the second frequency band at an output of the multiple-level switch alternately.

According to embodiments, the first frequency band and the second frequency band are both in the range of millimeter waves.

According to embodiments, the multiple-level switch comprises a plurality of switching channels, each of which includes three levels of switching units that are connected in series, each switching unit including a first switch and a second switch, a first terminal of the first switch being coupled to a first terminal of the second switch, the other terminal of the second switch being grounded.

In another aspect of the application, there is provided a circuit to generate a sweep frequency signal, the circuit comprising a reference frequency source operative to generate a reference frequency signal; a number N of frequency combination circuits operating on different frequency bands, with all the inputs coupled to an output of the reference frequency source, and operative to generate sweep frequency signals in the respective frequency bands at respective outputs based on the reference frequency signal, where N is equal to or larger than 3; a multiple-level switch with an input coupled to an output of the number N of frequency combination circuits; and a control circuit coupled to and controlling the number N of frequency combination circuits and the multiple-level switch to output the sweep frequency signal at a first frequency in the first frequency band, the sweep frequency signal at a first frequency in the second frequency band, . . . , the sweep frequency signal at a first frequency in the Nth frequency band, the sweep frequency signal at a second frequency in the first frequency band, the sweep frequency signal at a second frequency in the second frequency band, . . . , the sweep frequency signal at a second frequency in the Nth frequency band, . . . sequentially at an output of the multiple-level switch.

According to embodiments, the sweeping speed is enhanced, and the sweep frequency width is extended while the sweep frequency signal has a high pure spectrum (i.e., with a low noise level).

BRIEF DESCRIPTION OF THE DRAWINGS

In order to better understand the present invention, embodiments of the present invention are described with reference to the drawings below, where.

Figure 1:
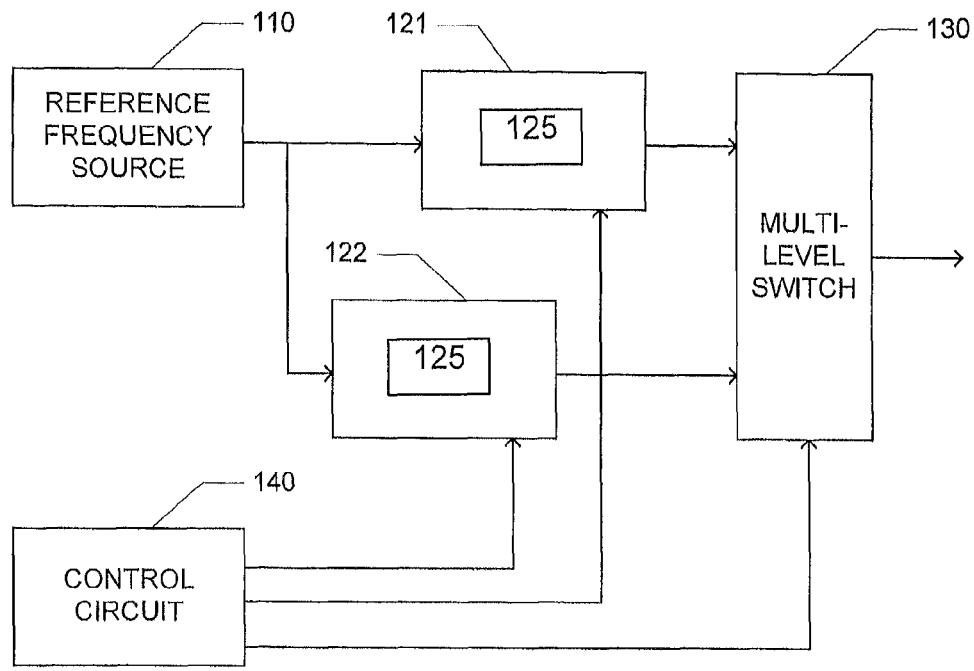
FIG. 1 illustrates a structural diagram of a circuit to generate a sweep frequency signal according to an embodiment of the invention.

All the circuits or structures of the embodiments are not shown in the drawings. Throughout the drawings, the same or similar components or elements are referenced by the same reference signs.

DETAILED DESCRIPTION OF THE EMBODIMENTS

Particular embodiments of the invention are described below in details. It shall be noted that the embodiments herein are used for illustration only, but not limiting the invention. In the description below, a number of particular details are explained to provide a better understanding of embodiments of the invention. However, it is apparent to those skilled in the art that embodiments of the invention can be implemented without these particular details. In other examples, well known circuits, materials or methods are not described so as not to obscure the embodiments of the invention.

Throughout the specification, the reference to "one embodiment," "an embodiment," "one example" or "an example" means that the specific features, structures or properties described in conjunction with the embodiment or example are included in at least one embodiment of the present invention. Therefore, the phrases "in one embodiment," "in an embodiment," "in one example" or "in an example" occurring at various positions throughout the specification may not refer to one and the same embodiment or example. Furthermore, specific features, structures or properties may be combined into one or several embodiments or examples in any appropriate ways. Moreover, it can be understood to those skilled in the art that the drawings are provided herein for illustration, and not necessarily drawn to scale. It shall be appreciated that if an element is referred to be "coupled to" or "connected to" another element, it means that it is directly coupled to the other element, or there is an intermediate element. On the contrary, if an element is referred to be "directly coupled to" or "directly connected to" another element, there is no intermediate element. The same reference signs are used to denote the same elements. The term "and/or" used herein means any and all combinations of one or more listed items.

By taking the sweeping speed, the spectrum width and the frequency pureness into account, there is provided a circuit to generate a sweep frequency signal. FIG. 1 illustrates a structural diagram of a circuit to generate a sweep frequency signal according to an embodiment of the invention.

As shown in FIG. 1, the circuit comprises a reference frequency source 110, a first frequency combination circuit 121, a second frequency combination circuit 122, a multiple-level switch 130 and a control circuit 140.

The reference frequency source 110 is, for example, an accurate reference frequency source that generates a reference frequency signal. The first frequency combination circuit 121 and the second frequency combination circuit 122 both are based on the PLL technique 125, and comprise for example a voltage controlled oscillator, a phase detector and a filter feedback loop.

The first frequency combination circuit 122 is operating on a first frequency band, with its input being coupled to the output of the reference frequency source 110, and generates a sweep frequency signal in the first frequency band at its output based on the reference frequency signal.

The second frequency combination circuit 122 operates on a second frequency band different from the first frequency band, with its input being coupled to the output of the reference frequency source 110, and generates a sweep frequency signal in the second frequency band at its output based on the reference frequency signal.

The multiple-level switch 130 has its input coupled to the output of the first frequency combination circuit 121 and to the output of the second frequency combination circuit 122. The control circuit 140 is coupled to and controls the first frequency combination circuit 121, the second frequency combination circuit 122 and the multiple-level switch 130 to output the sweep frequency signal in the first frequency band and the sweep frequency signal in the second frequency band at the output of the multiple-level switch 130 alternately.

Figure 2:
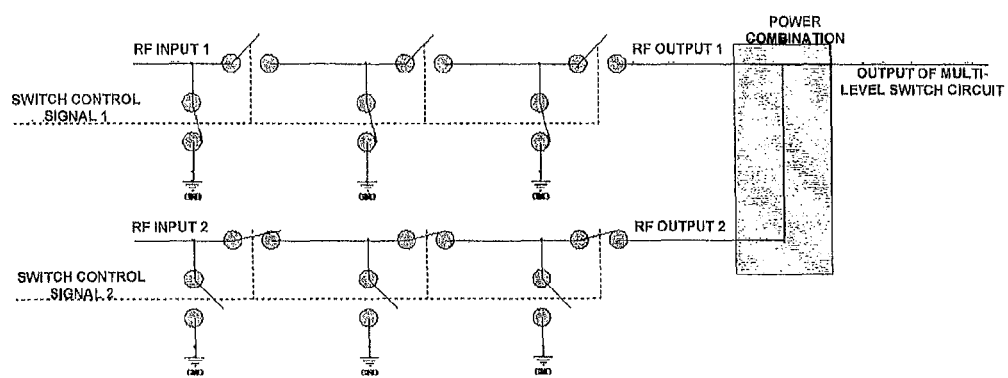
FIG. 2 illustrates a structure of a multiple-level switch according to an embodiment of the invention.

FIG. 2 illustrates a structure of a multiple-level switch according to an embodiment of the invention. The multiple-level switch comprises a plurality of switching channels, each of which include three levels of switching units that are connected in series. Each switching unit includes a first switch and a second switch, with a first terminal of the first switch being coupled to a first terminal of the second switch, the other terminal of the second switch being grounded.

As can be seen from FIG. 2, each switching channel includes three levels of switching units, each level comprising two switches. Signals on two switching channels that have passed the multiple-level switch are combined by a power combination circuit into a signal. With respect to an embodiment where two frequency combination circuits are used, the multiple-level switch only needs to have two switching channels. If a plurality of frequency combination circuits are used (e.g., for the case where N frequency combination circuits are used, where N is equal to or larger than 3), the multiple-level switch may have more switching channels.

The term "multiple-level" used herein means that a plurality of switching units is connected in series in one switching channel. For example, each switching channel has three levels of switching units, as shown in FIG. 2. Since the circuit according to the embodiment operates at high frequency, a switching unit is substantively coupled even if it is disconnected. Therefore, the multiple-level switch attenuates the signal level by level in the case that the switching units are disconnected. It is obvious to those skilled in the art to use more levels of switching units to constitute a switching circuit.

According to some embodiments, the reference frequency source 110 uses a single highly stable reference source to provide a reference frequency. The two frequency combination circuits 121 and 122 operate at different frequency bands. The multiple-level switch 130 is a two-level switch system. In this way, the sweeping speed is enhanced, and the sweep frequency width is extended while the sweep frequency signal has a high pure spectrum (i.e., with a low noise level), thereby the requirements of a millimeter wave imaging system on a sweep frequency signal can be satisfied.

In the embodiment as shown in FIG. 1, the two frequency combination circuits 121 and 122 operate at different frequency bands, respectively. For example, the first frequency combination circuit 121 generates a sweep frequency signal of frequency f1-f2, and the second frequency combination circuit 122 generates a sweep frequency signal of frequency f3-f4.

When the first frequency combination circuit 121 outputs a signal at frequency f1-1 stably, the second frequency combination circuit 122 is prepared for the next output frequency f2-1. When the second frequency combination circuit 122 outputs a signal at frequency f2-1 stably, the first frequency combination circuit 121 is prepared for the third output frequency f1-2. The first and second frequency combination circuits 121 and 122 along with the multiple-level switch 130 are so controlled to output signals at the output of the multiple-level switch at frequency f1-1, f2-1, f1-2, f2-2, f2 (the upper output frequency limit of the first frequency combination circuit 121), and f4 (the upper output frequency limit of the second frequency combination circuit 122).

In the case that the time constant of the loop filter circuit in the frequency combination circuits 121 and 122 has been determined, i.e., the circuit to generate the sweep frequency signal outputs a certain amount of noise, the hopping time of the circuit to generate the sweep frequency signal is a half compared to the case where a single frequency combination circuit is used. In other words, the hopping time is reduced when the same amount of noise is outputted, and thus the sweeping speed is enhanced. Since the first frequency combination circuit 121 and the second frequency combination circuit 122 operate at different frequency bands, the frequency width that is coved by the embodiment is doubled compared to the case where a single frequency combination circuit is used or two frequency combination circuits of the same frequency band are used.

Figure 3:
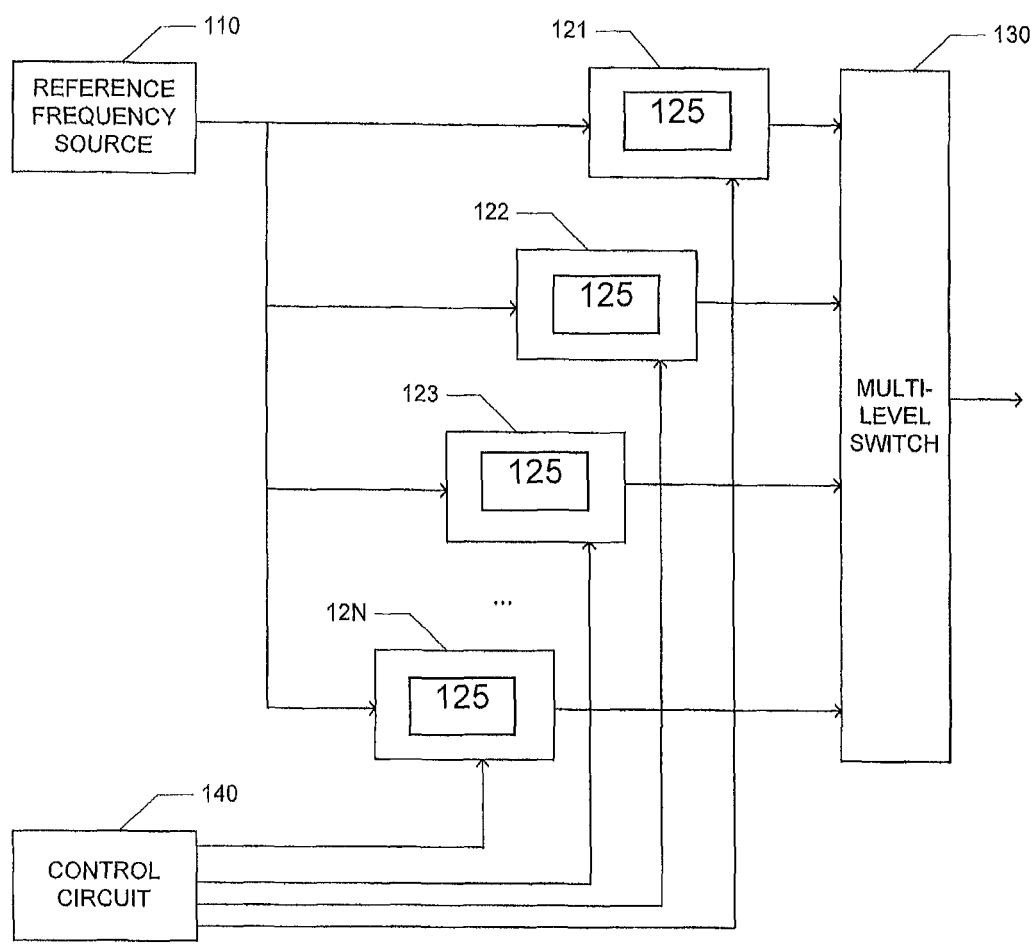
FIG. 3 illustrates a structural diagram of a circuit to generate a sweep frequency signal according to another embodiment of the invention.

Under the same concept, three or more frequency combination circuits may be used along with a corresponding multiple-level switch and a control circuit, to obtain a wideband, or even ultra-wideband, quick sweep frequency signal with a low loop noise level, as shown in FIG. 3.

FIG. 3 illustrates a structural diagram of a circuit to generate a sweep frequency signal according to another embodiment of the invention. Compared with FIG. 1, the circuit shown in FIG. 3 further comprises a third frequency combination circuit 123, . . . a Nth frequency combination circuit 12N, where N is equal to or larger than 3. Accordingly, the control circuit 140 and the multiple-level switch 130 vary to adapt to such change. The operating principle and operating flow are the same as the circuit shown in FIG. 1

The circuit shown in FIG. 3 comprises a reference frequency source 110, a number N of frequency combination circuits 121, . . . , 12N, a multiple-level switch 130 and a control circuit 140. The reference frequency source 110 generates a reference frequency signal. The N frequency combination circuits 121, . . . , 12N operate at different frequency bands, respectively, with all the input being coupled to an output of the reference frequency source 110, and generate sweep frequency signals in the respective frequency bands at respective outputs based on the reference frequency signal, where N is equal to or larger than 3. The multiple-level switch 130 has its input coupled to the output of the number of frequency combination circuits. The control circuit 140 is coupled to and controls the number of frequency combination circuits and the multiple-level switch to output the sweep frequency signal at a first frequency in the first frequency band, the sweep frequency signal at a first frequency in the second frequency band, . . . , the sweep frequency signal at a first frequency in the Nth frequency band, the sweep frequency signal at a second frequency in the first frequency band, the sweep frequency signal at a second frequency in the second frequency band, . . . , the sweep frequency signal at a second frequency in the Nth frequency band, . . . sequentially at an output of the multiple-level switch.

In this way, the three parameters mentioned previously can be further improved (i.e., shortening the time required for sweeping, reducing the noise in the output signal and extending the frequency width of the sweep frequency signal) by adding a number of frequency combination circuits.

According to embodiments, the time required for sweeping is shortened, the noise in the output signal is reduced, and the frequency width of the sweep frequency signal is extended, and so the requirements of a millimeter wave imaging system on a sweep frequency signal may be satisfied. The method can be applied to generation of sequential sweep frequency ultra-wideband signals of other bands.

While the present invention has been described with reference to several typical embodiments, it is apparent to those skilled in the art that the terms are used for illustration and explanation purpose and not for limitation. The present invention may be practiced in various forms without departing from the spirit or essence of the invention. It should be understood that the embodiments are not limited to any of the foregoing details, and shall be interpreted broadly within the spirit and scope as defined by the following claims. Therefore, modifications and alternatives falling within the scope of the claims and equivalents thereof are to be encompassed by the scope of the present invention which is defined by the claims as attached.

What is claimed is:

1. A circuit to generate a sweep frequency signal, the circuit comprising:

a reference frequency source operative to generate a reference frequency signal;

a first frequency combination circuit operating on a first frequency band spanning a range of frequencies, with an input coupled to an output of the reference frequency source, and operative to generate a sweep frequency signal in the first frequency band at its output based on the reference frequency signal;

a second frequency combination circuit operating on a second frequency band spanning a range of frequencies that doesn't overlap the range of frequencies of the first frequency band, with an input coupled to the output of the reference frequency source, and operative to generate a sweep frequency signal in the second frequency band at its output based on the reference frequency signal, wherein each of the first frequency combination circuit and the second frequency combination circuit comprises a phase locked loop;

a multiple-level switch with an input coupled to an output of the first frequency combination circuit and to an output of the second frequency combination circuit, the multiple-level switch comprising a plurality of switching units connected in series in a switching channel of the multiple-level switch; and a control circuit coupled to and controlling the first frequency combination circuit, the second frequency combination circuit and the multiple-level switch to output (i) the sweep frequency signal at a first frequency in the first frequency band, immediately followed by the sweep frequency signal at a first frequency in the second frequency band, (ii) immediately followed by the sweep frequency signal at a second frequency in the first frequency band, immediately followed by the sweep frequency signal at a second frequency in the second frequency band, and (iii) continuing the pattern of (i) and (ii) to a sweep frequency signal at a Mth frequency in the second frequency band where M is equal to or larger than 3, at an output of the multiple-level switch.

2. The circuit to generate a sweep frequency signal according to claim 1, wherein when the first frequency combination circuit outputs a first sweep frequency signal in the first frequency band stably, the second frequency combination circuit is prepared for a first sweep frequency signal in the second frequency band; and when the second frequency combination circuit outputs the first sweep frequency signal in the second frequency band stably, the first frequency combination circuit is prepared for a second sweep frequency signal in the first frequency band.

3. The circuit to generate a sweep frequency signal according to claim 1, wherein the first frequency band and the second frequency band both are in the range of millimeter waves.

4. The circuit to generate a sweep frequency signal according to claim 1, wherein the multiple-level switch comprises a plurality of switching channels, each of which includes three levels of switching units that are connected in series, each switching unit including a first switch and a second switch, a first terminal of the first switch being coupled to a first terminal of the second switch, another terminal of the second switch being grounded.

5. The circuit to generate a sweep frequency signal according to claim 1, wherein the multiple-level switch comprises a plurality of switching channels, each switching channel connecting the input of the multiple-level switch to the output of the multiple-level switch and each switching channel including a plurality of levels of switching units that are connected in series, each switching unit including a first switch and a second switch.

6. The circuit to generate a sweep frequency signal according to claim 5, wherein, for each switching unit, a first terminal of the first switch is coupled to a first terminal of the second switch and another terminal of the second switch is grounded.

7. A circuit to generate a sweep frequency signal, the circuit comprising:
a reference frequency source operative to generate a reference frequency signal;
a number N of frequency combination circuits operating on non-overlapping frequency bands, with all the inputs coupled to an output of the reference frequency source, and operative to generate sweep frequency signals in the respective frequency bands at respective outputs based on the reference frequency signal, where N is equal to or larger than 3, wherein each of the N frequency combination circuits comprises a phase locked loop;
a multiple-level switch with an input coupled to an output of the number N of frequency combination circuits, the multiple-level switch comprising a plurality of switching units connected in series in a switching channel of the multiple-level switch; and
a control circuit coupled to and controlling the number N of frequency combination circuits and the multiple-level switch to output (i) the sweep frequency signal at a first frequency in the first frequency band, immediately followed by the sweep frequency signal at a first frequency in the second frequency band, . . . , immediately followed by the sweep frequency signal at a first frequency in the Nth frequency band, (ii) immediately followed by the sweep frequency signal at a second frequency in the first frequency band, immediately followed by the sweep frequency signal at a second frequency in the second frequency band, . . . , immediately followed by the sweep frequency signal at a second frequency in the Nth frequency band, and (iii) continuing the pattern of (i) and (ii) to a sweep frequency signal at the Mth frequency in the Nth frequency band where M is equal to or larger than 3, at an output of the multiple-level switch.

8. The circuit to generate a sweep frequency signal according to claim 7, wherein each of the respective frequency bands is in the range of millimeter waves.

9. The circuit to generate a sweep frequency signal according to claim 7, wherein the multiple-level switch comprises a plurality of switching channels, each of which includes three levels of switching units that are connected in series, each switching unit including a first switch and a second switch, a first terminal of the first switch being coupled to a first terminal of the second switch, another terminal of the second switch being grounded.

10. The circuit to generate a sweep frequency signal according to claim 7, wherein the multiple-level switch comprises a plurality of switching channels, each switching channel connecting the input of the multiple-level switch to the output of the multiple-level switch and each switching channel including a plurality of levels of switching units that are connected in series, each switching unit including a first switch and a second switch.

11. The circuit to generate a sweep frequency signal according to claim 10, wherein, for each switching unit, a first terminal of the first switch is coupled to a first terminal of the second switch and another terminal of the second switch is grounded.

12. A method to generate a sweep frequency signal, the method comprising:
generating a reference frequency signal using a reference frequency source;
generating, using a first frequency combination circuit operating on a first frequency band spanning a range of frequencies and having an input coupled to an output of the reference frequency source, a sweep frequency signal in the first frequency band at an output of the first frequency combination circuit based on the reference frequency signal;
generating, using a second frequency combination circuit operating on a second frequency band spanning a range of frequencies that doesn't overlap the range of frequencies of the first frequency band and having an input coupled to an output of the reference frequency source, a sweep frequency signal in the second frequency band at an output of the second frequency combination circuit based on the reference frequency signal, wherein each of the first frequency combination circuit and the second frequency combination circuit comprises a phase locked loop; and
controlling, using a control circuit, the first frequency combination circuit, the second frequency combination circuit and a multiple-level switch with an input coupled to an output of the first frequency combination circuit and to an output of the second frequency combination circuit, to output (i) the sweep frequency signal at a first frequency in the first frequency band, immediately followed by the sweep frequency signal at a first frequency in the second frequency band, (ii) immediately followed by the sweep frequency signal at a second frequency in the first frequency band, immediately followed by the sweep frequency signal at a second frequency in the second frequency band, and (iii) continuing the pattern of (i) and (ii) to a sweep frequency signal at a Mth frequency in the second frequency band where M is equal to or larger than 3, at an output of the multiple-level switch, wherein the multiple-level switch comprises a plurality of switching units connected in series in a switching channel of the multiple-level switch.

13. The method according to claim 12, wherein
when the first frequency combination circuit outputs a first sweep frequency signal in the first frequency band stably, the second frequency combination circuit prepares for a first sweep frequency signal in the second frequency band; and when the second frequency combination circuit outputs the first sweep frequency signal in the second frequency band stably, the first frequency combination circuit prepares for a second sweep frequency signal in the first frequency band.

14. The method according to claim 12, wherein the first frequency band and the second frequency band both are in the range of millimeter waves.

15. The method according to claim 12, wherein the multiple-level switch comprises a plurality of switching channels, each of which includes three levels of switching units that are connected in series, each switching unit including a first switch and a second switch, a first terminal of the first switch being coupled to a first terminal of the second switch, another terminal of the second switch being grounded.

16. The method according to claim 12, wherein the multiple-level switch comprises a plurality of switching channels, each switching channel connecting the input of the multiple-level switch to the output of the multiple-level switch and each switching channel including a plurality of levels of switching units that are connected in series, each switching unit including a first switch and a second switch.

17. The method according to claim 12, further comprising:

generating, using a number N of frequency combination circuits operating on different frequency bands and having their inputs coupled to the output of the reference frequency source, sweep frequency signals in their respective frequency bands at their respective outputs based on the reference frequency signal, where N is equal to or larger than 3 and the number N frequency combination circuits include the first frequency combination circuit and the second frequency combination circuit; and controlling, using the control circuit, the number N of frequency combination circuits and the multiple-level switch with its input coupled to the output of the number N of frequency combination circuits, to output (i) the sweep frequency signal at a first frequency in the first frequency band, immediately followed by the sweep frequency signal at a first frequency in the second frequency band, . . . , immediately followed by the sweep frequency signal at a first frequency in the Nth frequency band, (ii) immediately followed by the sweep frequency signal at a second frequency in the first frequency band, immediately followed by the sweep frequency signal at a second frequency in the second frequency band, . . . , immediately followed by the sweep frequency signal at a second frequency in the Nth frequency band, and (iii) continuing the pattern of (i) and (ii) to a sweep frequency signal at the Mth frequency in the Nth frequency band where M is equal to or larger than 3, at the output of the multiple-level switch.

\* \* \* \* \*